(12) United States Patent
Glaser et al.

(10) Patent No.: US 10,901,011 B2
(45) Date of Patent: Jan. 26, 2021

(54) MAGNETIC FIELD PULSE CURRENT SENSING FOR TIMING-SENSITIVE CIRCUITS

(71) Applicant: Efficient Power Conversion Corporation, El Segundo, CA (US)

(72) Inventors: John S. Glaser, Niskayuna, NY (US); Michael A. de Rooij, Playa Vista, CA (US)

(73) Assignee: Efficient Power Conversion Corporation, El Segundo, CA (US)

(*) Notice: Subject to any disclaimer, the term of this patent is extended or adjusted under 35 U.S.C. 154(b) by 0 days.

(21) Appl. No.: 16/674,665

(22) Filed: Nov. 5, 2019

(65) Prior Publication Data

US 2020/0141983 A1 May 7, 2020

Related U.S. Application Data

(60) Provisional application No. 62/756,191, filed on Nov. 6, 2018.

(51) Int. Cl.
*G01R 31/02* (2006.01)
*G01R 19/00* (2006.01)
(Continued)

(52) U.S. Cl.
CPC ....... *G01R 19/0092* (2013.01); *G01R 33/093* (2013.01); *G01R 33/063* (2013.01)

(58) Field of Classification Search
USPC .......................................... 324/117 R, 117 H
See application file for complete search history.

(56) References Cited

U.S. PATENT DOCUMENTS

| | | | |
|---|---|---|---|
| 4,377,782 A | * | 3/1983 | Metcalf ................ G01R 31/088 324/524 |
| 4,473,810 A | | 9/1984 | Souques et al. |

(Continued)

*Primary Examiner* — Vincent Q Nguyen
(74) *Attorney, Agent, or Firm* — Blank Rome LLP (57) ABSTRACT

A current measurement circuit for determining a start time $t_{START}$, an end time $t_{END}$, and/or a peak time $t_{MAX}$ for a current pulse passing through a current conductor. The current measurement circuit includes a pickup coil and a threshold crossing detector. The pickup coil generates a voltage $V_{SENSE}'$ proportional to a magnetic field around the conductor, which is proportional to a change in current over time. The threshold crossing detector compares $V_{SENSE}'$ and a threshold voltage and generates an output signal indicative of a transition time and whether a slope of $V_{SENSE}'$ is positive or negative. The current measurement circuit can also include an integrator and a sample and hold circuit. The integrator integrates $V_{SENSE}'$ over time and generates an integrated signal $V_{SENSE}$. The sample and hold circuit compares $V_{SENSE}$ to $t_{MAX}$ and generates a second output signal which can be used to measure the pulse current.

16 Claims, 6 Drawing Sheets

(51) Int. Cl.
*G01R 33/09* (2006.01)
*G01R 33/06* (2006.01)

(56) References Cited

U.S. PATENT DOCUMENTS

| | | |
|---|---|---|
| 4,771,188 A | 9/1988 | Cheng et al. |
| 8,773,123 B2 | 7/2014 | Doogue et al. |
| 2007/0115008 A1* | 5/2007 | Barth .................... G01R 15/146 |
| | | 324/713 |
| 2014/0306551 A1* | 10/2014 | Jost ........................ G01R 19/00 |
| | | 307/131 |
| 2018/0321282 A1* | 11/2018 | Hurwitz ............... G01R 15/207 |

* cited by examiner

MAGNETIC FIELD PULSE CURRENT SENSING FOR TIMING-SENSITIVE CIRCUITS

This application claims the benefit of U.S. Provisional Application No. 62/756,191, filed on Nov. 6, 2018, the entire disclosure of which is hereby incorporated by reference.

BACKGROUND

1. Field of the Invention

The present invention relates generally to current measurement circuits based on magnetic field sensing, and more particularly to a current measurement circuit for determining a start time and an end time for a current pulse.

2. Description of the Related Art

In many applications for pulse current generators, the output current pulses must meet particular specifications such as precise start and end times and a maximum or minimum current value. For example, in a time-of-flight (ToF) light detection and ranging (lidar) system for an autonomous vehicle, a pulse current generator acts as a laser driver. The time delay between transmission of a laser pulse and detection of its reflection can be used to determine the distance between the laser and objects in the environment. Because the speed of light is 30 centimeters (cm) per nanosecond (ns), short laser pulses are advantageous when the distance measurement resolution requirements are demanding. As an example, for centimeter-scale resolution, the laser pulse width is often on the order of ones to tens of ns, and the time delay for reflections off nearby objects can be just a few ns.

Thus, the ToF lidar system must be able to precisely determine the laser pulse's start and end times, within a single ns or less, oftentimes as precisely as within 100 picoseconds (ps) or smaller, in order to accurately determine the laser pulse width and the time delay between transmission of the laser pulse and detection of its reflection. The performance of ToF lidar systems is also affected by the amplitude of the laser pulse, with increasing pulse amplitude resulting in its reflection being detectable after traveling increasing distances. However, the maximum amplitude of the laser pulse must comply with eye safety regulations, and the laser driver must limit the peak amplitude of the current pulse accordingly. Thus, it is advantageous to transmit laser pulses at the maximum amplitude at which safety considerations are satisfied.

Many pulse current generators include a feedback system to measure the output current pulses and make appropriate adjustments. These feedback systems include a current measurement circuit and a controller for the pulse current generator. The current measurement circuit produces a signal that is proportional to the current being measured, typically in the form of a voltage. From this signal, it is possible to determine the start and end times of the current pulses, as well as the peak amplitudes of the current pulses, which the controller uses to adjust parameters of the current pulse generator. However, the output current pulses may be on the order of tens to hundreds of amperes (A) in some applications, which makes current sensing more complicated. If extremely short pulses are required, such as the aforementioned ns pulses, the parasitic effects of current sensing circuits can be detrimental to the operation of the driver.

Figure 1:
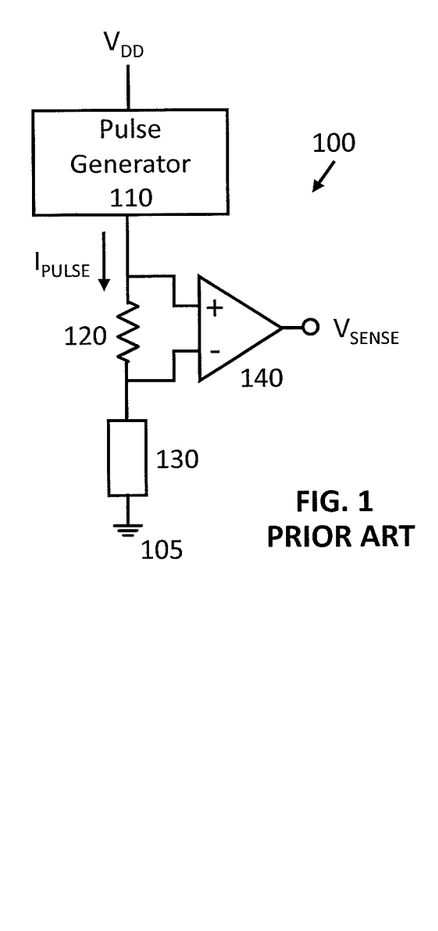
FIG. 1 illustrates a schematic of a conventional current measurement circuit with a shunt resistor.

FIG. 1 illustrates a schematic of a conventional current measurement circuit 100 with a shunt resistor 120. The pulse generator 110 outputs a current pulse $I_{PULSE}$, which is provided to the load 130 through the shunt resistor 120. Given a shunt resistance value $R_{SHUNT}$, a voltage $V_{SHUNT}$ will be generated according to Ohm's Law. In order to reduce the effect of the shunt resistor on the pulse generator, $R_{SHUNT}$ is usually very small, on the order of milliohms (mΩ). This results in small values of $V_{SHUNT}$, hence often a differential amplifier 140 is connected to the terminals of the shunt resistor 120 and outputs an amplified voltage $V_{SENSE}$ that is proportional to $I_{PULSE}$. The short pulses in some applications place stringent demands on the amplifier 140, such as high bandwidth.

Even with mΩ values of $R_{SHUNT}$, very large amplitude current pulses cause the shunt resistor 120 to dissipate large amounts of power as heat, which may damage other components on the circuit or unnecessarily strain the power supply or battery of the system. Further, shunt resistor 120 may experience thermal drift as it heats up, changing its resistance and $V_{SENSE}$ such that computationally expensive compensation is necessary to precisely determine the start and end times and the peak amplitude of the current pulse. The shunt resistor 120 directly measures $I_{PULSE}$, which means it is placed within the main driver signal chain and disadvantageously increases the inductance of the main driver circuit.

Figure 2A:
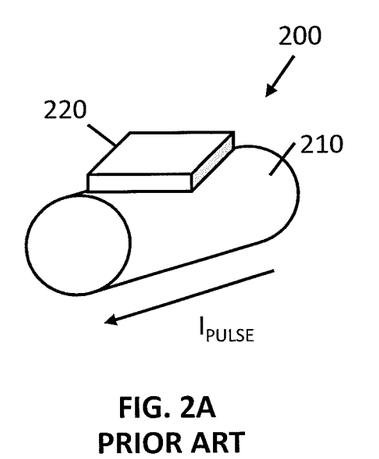
FIGS. 2A-B illustrate an arrangement of a Hall sensor relative to a current conductor, and a schematic of a conventional current measurement circuit with a Hall sensor.
Figure 2B:
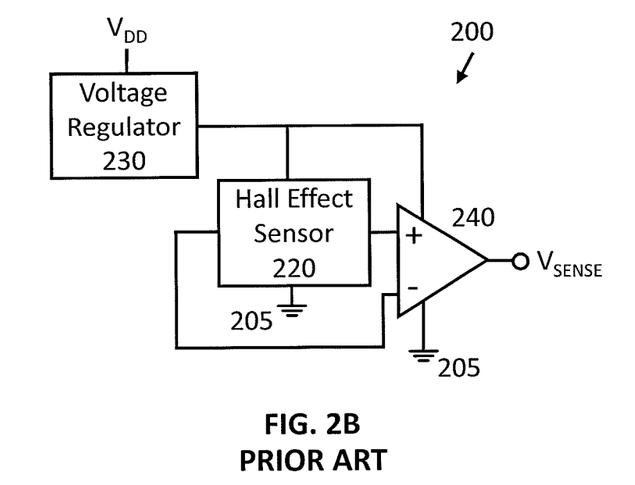

Some current measurement circuits avoid the power loss and increased inductance associated with shunt current measurement by indirectly measuring the current pulse through the resulting magnetic induction, or magnetic flux density. The magnetic flux density induced by a current through a conductor can be measured by a Hall Effect sensor, a flux gate sensor, magneto-resistor or a giant magneto-resistor, among others. FIGS. 2A-B illustrate an arrangement of a Hall sensor 220 relative to a current conductor 210 carrying the current pulse $I_{PULSE}$, and a schematic of a conventional current measurement circuit 200 with the Hall sensor 220. In FIG. 2A, the Hall sensor 220 is placed near the current conductor 210, such that a change in the magnetic flux density around conductor 210, caused by $I_{PULSE}$, is detected by Hall sensor 220.

In FIG. 2B, the Hall sensor 220 outputs a voltage to a high gain amplifier 240. The high gain amplifier amplifies the small output voltage from the Hall sensor 220 into the larger voltage $V_{SENSE}$, which is proportional to the magnetic flux density around conductor 210 from $I_{PULSE}$. However, Hall sensor 220 and other current sensing methods based on the magnetic flux density depend on semiconductor materials subject to thermal drift or that exhibit nonlinear behavior. Both thermal drift and nonlinear behavior require active circuitry to recalibrate and compensate for changes in device characteristics and to analyze the nonlinear responses. Furthermore, most of the active circuitry required for Hall sensors has stringent requirements, particularly high bandwidth for short pulse applications, similar to the stringent requirements placed on differential amplifier 140 shown in FIG. 1.

Some current measurement circuits attempt to avoid some of the active circuitry requirements associated with measuring the current pulse through magnetic induction by instead measuring the rate of change of the magnetic flux, that is, the magnetic field. The magnetic field can be measured by a current transformer or a Rogowksi coil, for example. Current transformers include a magnetic core around which the secondary winding is placed. The magnetic core can saturate at high currents and increases the inductance of the system such that operation of other components is affected. Some magnetic cores with high permeability have a high saturation flux density but poor high frequency responses.

Figure 3:
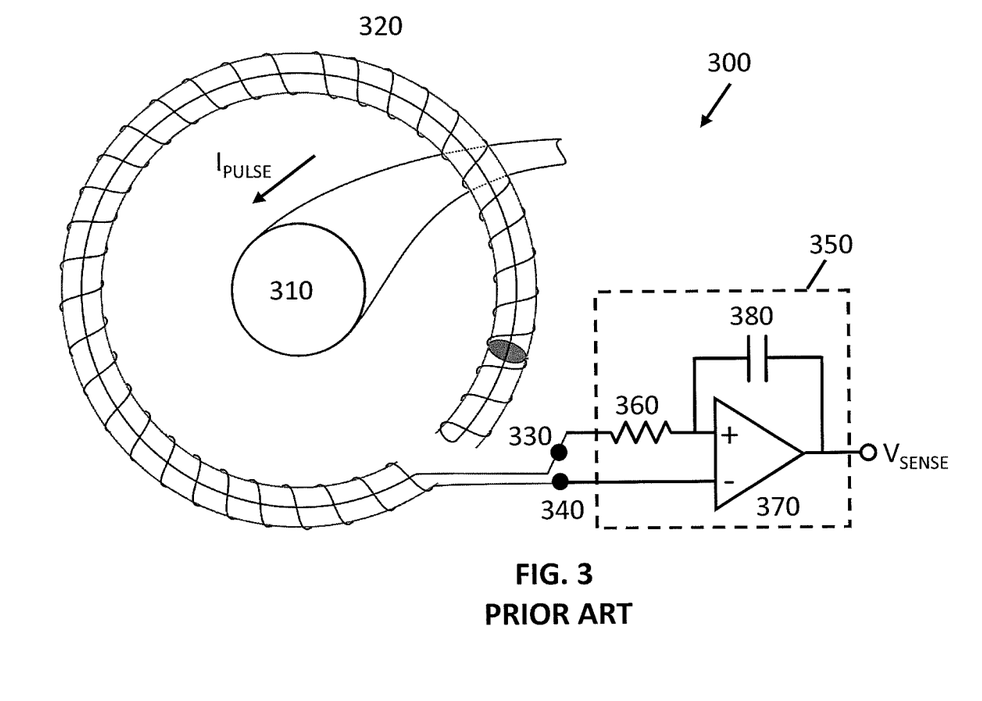
FIG. 3 illustrates a schematic of a conventional current measurement circuit with a Rogowski coil.

Rogowski coils do not include magnetic cores and so are immune to saturation and can have large bandwidths, but otherwise can be viewed as a current transformer with a small magnetizing inductance and an approximately open circuit burden on the winding terminals. FIG. 3 illustrates a schematic of a conventional current measurement circuit 300 using a Rogowski coil 320. The Rogowski coil 320 is placed around conductor 310 carrying the current pulse $I_{PULSE}$, and comprises a helical coil with the lead 330 from one end of the coil running through the center of the coil to the other lead 340. Leads 330 and 340 are connected to an integrator 350, which integrates the output of the Rogowski coil 320 over time to obtain the voltage $V_{SENSE}$ proportional to $I_{PULSE}$.

Both Rogowski coils and current transformers encircle the conductor carrying $I_{PULSE}$ to reduce the influence of other magnetic fields, such as from the Earth. However, the need to encircle the conductor makes construction of a semiconductor die including a Rogowski coil or a current transformer difficult. In particular, current transformers may occupy large areas of the semiconductor die, which is a disadvantage in lidar systems, for example, in which laser diodes and their drivers are placed close together and precisely aligned to simplify alignment of optical components such as lenses. Similarly, integrating a Rogowski coil into a printed circuit board impacts multiple layers of the board and requires a large number of vias.

SUMMARY OF THE INVENTION

The present invention addresses the disadvantages of power dissipation, increased inductance in the main driver circuit, active circuitry, large area and complex construction discussed above, by providing a current measurement circuit that comprises a pickup coil that does not need to encircle the current conductor. More specifically, the present invention, as described herein, comprises a pickup coil and at least one threshold crossing detector. The pickup coil generates a voltage proportional to a magnetic field around the current conductor, which is proportional to a change in current through the current conductor over time. The threshold crossing detector compares the voltage proportional to the magnetic field to at least one threshold voltage and generates, based upon the selected threshold voltage, an output signal indicative of a transition time (e.g., the start time, the end time, or the peak amplitude time) of the current pulse and whether a slope of the voltage proportional to the magnetic field over time is positive or negative based on the comparison.

In a further embodiment, the current measurement circuit also includes an integrator and a sample and hold circuit. The integrator integrates the voltage proportional to the magnetic field over time and generates an integrated signal based on the integrated voltage, with the resulting signal being proportional to the current to be measured. The sample and hold circuit is triggered by a signal indicative of the peak amplitude time.

In further embodiments, the pickup coil is a single loop configured to be arranged near the current conductor, which may be monolithically integrated onto a single semiconductor chip. In a further embodiment, the pickup coil may have one or more turns arranged to increase the total magnetic flux resulting from the current to be measured through the entirety of the coil while reducing the total flux from other sources. In other embodiments, a portion of the pickup coil is integrated on a semiconductor chip with the at least one threshold crossing detector, and a portion of the pickup coil is formed by die terminals and an external conductor. The external conductor may form part of a mounting substrate such as a printed circuit board including the current conductor.

The above and other preferred features described herein, including various novel details of implementation and combination of elements, will now be more particularly described with reference to the accompanying drawings and pointed out in the claims. It should be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The features, objects, and advantages of the present disclosure will become more apparent from the detailed description set forth below when taken in conjunction with the drawings in which like reference characters identify correspondingly throughout and wherein.

DETAILED DESCRIPTION OF THE PREFERRED EMBODIMENTS

In the following detailed description, reference is made to certain embodiments. These embodiments are described with sufficient detail to enable those skilled in the art to practice them. It is to be understood that other embodiments may be employed and that various structural, logical, and electrical changes may be made. The combinations of features disclosed in the following detailed description may not be necessary to practice the teachings in the broadest sense, and are instead taught merely to describe particularly representative examples of the present teachings.

Figure 4A:
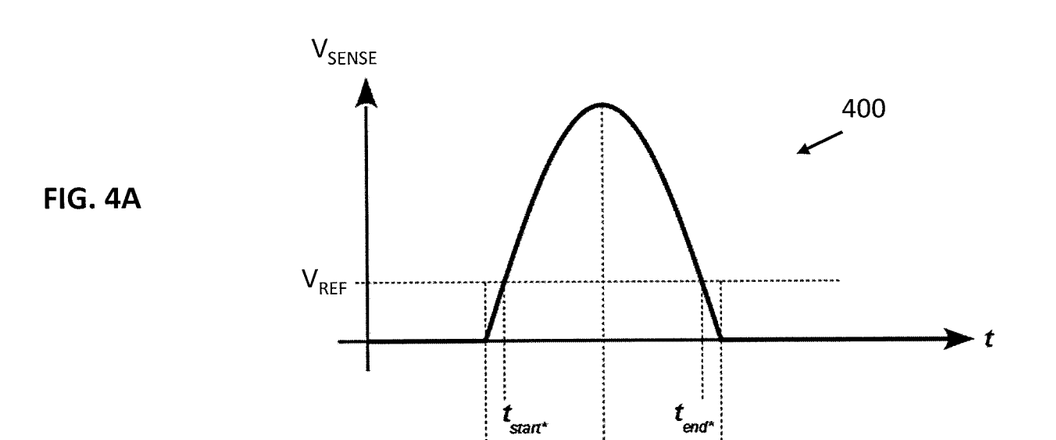
FIGS. 4A-B show a graph of a voltage output from a conventional current measurement circuit such as the circuits shown in FIGS. 1-3 resulting from a current pulse of the same approximate shape, and a graph of the derivative of the aforementioned voltage output.

FIG. 4A shows a graph of a voltage output from a conventional current measurement circuit such as the circuits shown in FIGS. 1-3, and FIG. 4B shows the derivative of the voltage output from the conventional current measurement circuit. Graph 400 shows the output voltage $V_{SENSE}$ from a conventional current measurement circuit over time, where $V_{SENSE}$ is substantially proportional to the current pulse $I_{PULSE}$ being sensed. To determine the start time $t_{START}$ and end time $t_{END}$ of the current pulse $I_{PULSE}$, some systems compare $V_{SENSE}$ to a predetermined threshold $V_{REF}$ and determine the start time $t_{START}$* in response to $V_{SENSE}$ increasing above $V_{REF}$ and the end time $t_{END}$* in response to $V_{SENSE}$ decreasing below $V_{REF}$. As illustrated in graph 400, the half-sinusoid $V_{SENSE}$ has a more gradual slope than a square wave and may not change above or below $V_{REF}$ until some period of time after $t_{START}$ or before $t_{END}$.

Thus, the inaccurate $t_{START}$* and $t_{END}$* introduce error into calculations using them, for example distance calculations based on the time delay between transmission of a laser pulse and detection of its reflection from the environment. Further, the accuracy of $t_{START}$* and $t_{END}$* is dependent on the slope and the peak amplitude of $I_{PULSE}$, which then necessitates additional calculations to compensate for changes in the peak amplitude of $I_{PULSE}$. While this method for determining $t_{START}$ and $t_{END}$ may be acceptably accurate when $V_{SENSE}$ is a rectangular pulse, it may not meet the one ns or less accuracy required when $V_{SENSE}$ is a non-rectangular pulse such as a half-sinusoid.

Figure 4B:
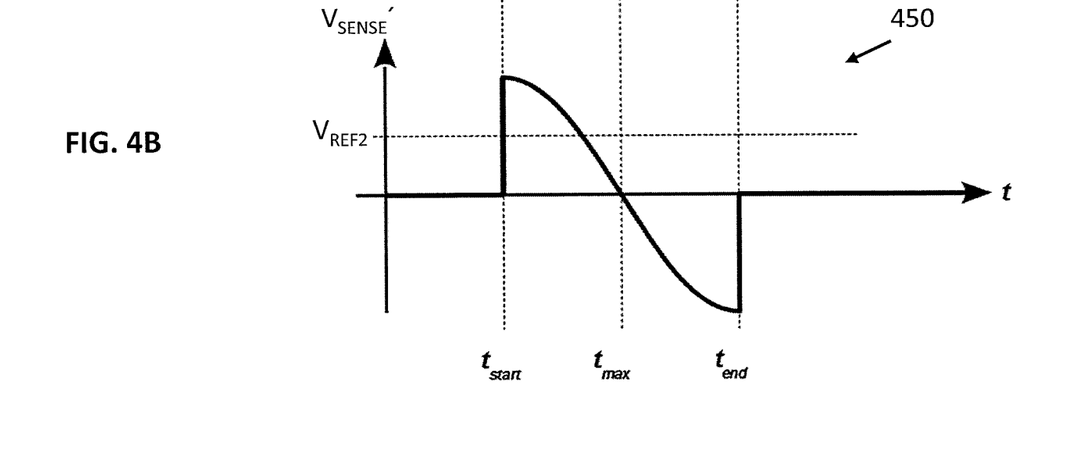

To more accurately and consistently determine $t_{START}$ or $t_{END}$ of $I_{PULSE}$, some systems calculate the derivative with respect to time $V_{SENSE}'$ of $V_{SENSE}$, shown in graph 450, which experiences sharp increases from and to zero at $t_{START}$ and $t_{END}$ of $I_{PULSE}$ due to the change in slope of $V_{SENSE}$. The systems then compare the derivative $V_{SENSE}'$ to a different predetermined threshold $V_{REF2}$. The dramatic change in the value of $V_{SENSE}'$ at $t_{START}$ and $t_{END}$ of $I_{PULSE}$ reduces error in the determined start and end times $t_{START}$* and $t_{END}$* and removes the dependency on the peak amplitude of $I_{PULSE}$ and the chosen value of $V_{REF2}$. Some systems set $V_{REF2}$ to zero, which allows them to also determine the time $t_{MAX}$ at which $I_{PULSE}$ reaches its peak amplitude. However, calculation of the derivative $V_{SENSE}'$ emphasizes noise relative to $V_{SENSE}$ and often necessitates filtering to reduce the noise. The introduced noise and additional filtering steps further complicate the system and degrade system performance and accuracy. The process of determining when a threshold is crossed and the sign of the slope of the crossing is known by various terms such as edge detection, zero-crossing detection, and threshold crossing detection. It is generally accomplished with a combination of comparators and digital logic. Such circuits and methods are generally recognized by those skilled in the art.

Figure 5:
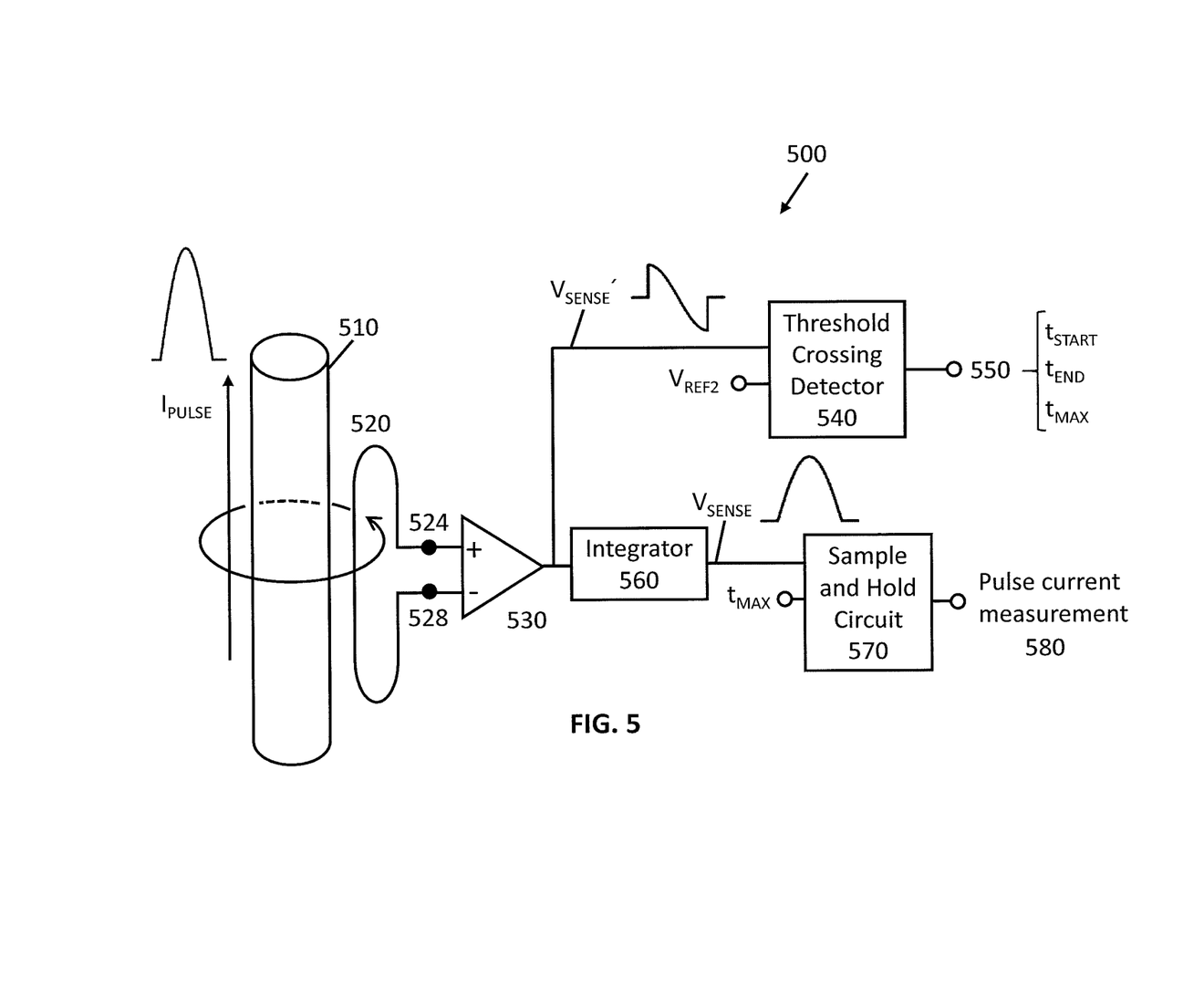
FIG. 5 illustrates a current measurement circuit according to an embodiment of the present invention.

FIG. 5 shows a current measurement circuit 500 according to an embodiment of the present invention. A pickup coil 520 is placed near conductor 510 carrying the current pulse $I_{PULSE}$ such that pickup coil 520 detects the time-varying magnetic field induced by $I_{PULSE}$. The leads 524 and 528 are loaded with an impedance much larger than the coil impedance within the frequency band of interest, causing the voltage at the leads 524 and 528 to be proportional to the derivative of the magnetic field strength, which is itself proportional to $I_{PULSE}$. The voltage at the leads 524 and 528 can be amplified by an optional amplifier 530 or output directly as the derivative $V_{SENSE}'$, illustrated in graph 450 in FIG. 4B, which is proportional to the derivative of $I_{PULSE}$:

$$V'_{SENSE} = K \frac{dI_{PULSE}}{dt}$$

where K is a constant dependent on characteristics of pickup coil 520 such as the area of the loop, the number of turns, or the position of the turns with respect to the conductor 510 carrying $I_{PULSE}$.

$V_{SENSE}'$, either from leads 524 and 528 or from the output of the optional amplifier 530, is provided to a threshold crossing detector 540 which also receives the reference voltage $V_{REF2}$ and generates an output signal 550. By appropriately setting $V_{REF2}$, output signal 550 can be indicative of $t_{START}$, $t_{END}$, or $t_{MAX}$ without use of a circuit or method to calculate a derivative and the resulting noise amplification. Current measurement circuit 500 also avoids the area, power consumption, and component cost associated with a high-speed analog-to-digital converter for sampling $V_{SENSE}$ in order to digitally calculate $t_{START}$ and $t_{END}$.

In some embodiments of the present invention, an integrator 560 can be used to integrate $V_{SENSE}'$ to obtain $V_{SENSE}$ for other calculations:

$$V_{SENSE} = \int K \frac{dI_{PULSE}}{dt} = KI_{PULSE}$$

In this example, $V_{SENSE}$ is provided to a sampler or sample and hold circuit 570 which also receives $t_{MAX}$ (from output 550) and generates an output signal 580 which can be used to measure the pulse current.

The pickup coil 520 does not include a magnetic core and may be a Rogowski coil. For very large amplitude $I_{PULSE}$, the resulting magnetic field is very large, and fewer turns and a smaller loop area, even a single loop in proximity to the conductor 510 may be sufficient to detect the magnetic field. The magnetic field for a very large $I_{PULSE}$ is much larger than the magnetic fields for currents other than $I_{PULSE}$ or ambient magnetic fields, such that the error introduced by the other magnetic fields can be ignored and the pickup coil 520 need not encircle conductor 510. The turn or turns of the pickup coil may be arranged to maximize the total magnetic flux resulting from the current in conductor 510 to be measured through the entirety of the coil while minimizing the total flux from other sources. Because the pickup coil 520 does not include a magnetic core, the pickup coil 520 does not saturate at high currents or experience bandwidth limitations based on the permittivity of a magnetic core. Pickup coil 520 also avoids the thermal drift associated with semiconductor components such as Hall sensors and shunt resistors.

The pickup coil 520 can be monolithically integrated into a semiconductor die because it may have a smaller loop area and fewer turns than a Rogowski coil and need not encircle the conductor 510. Similarly, the pickup coil 520 can be placed in strategic locations near loads or bus capacitors. In addition, the current measurement circuit 500 is isolated from the main driver signal chain and adds negligible impedance to the main driver circuit such that current measurement circuit 500 does not substantially affect operation of the main driver circuit. The isolation between the current measurement circuit 500 and the main driver circuit allows the current measurement circuit 500 to sense both positive and negative currents even in circuits with a zero volt minimum supply voltage, which simplifies zero crossing detection for $V_{SENSE}'$.

Figure 6:
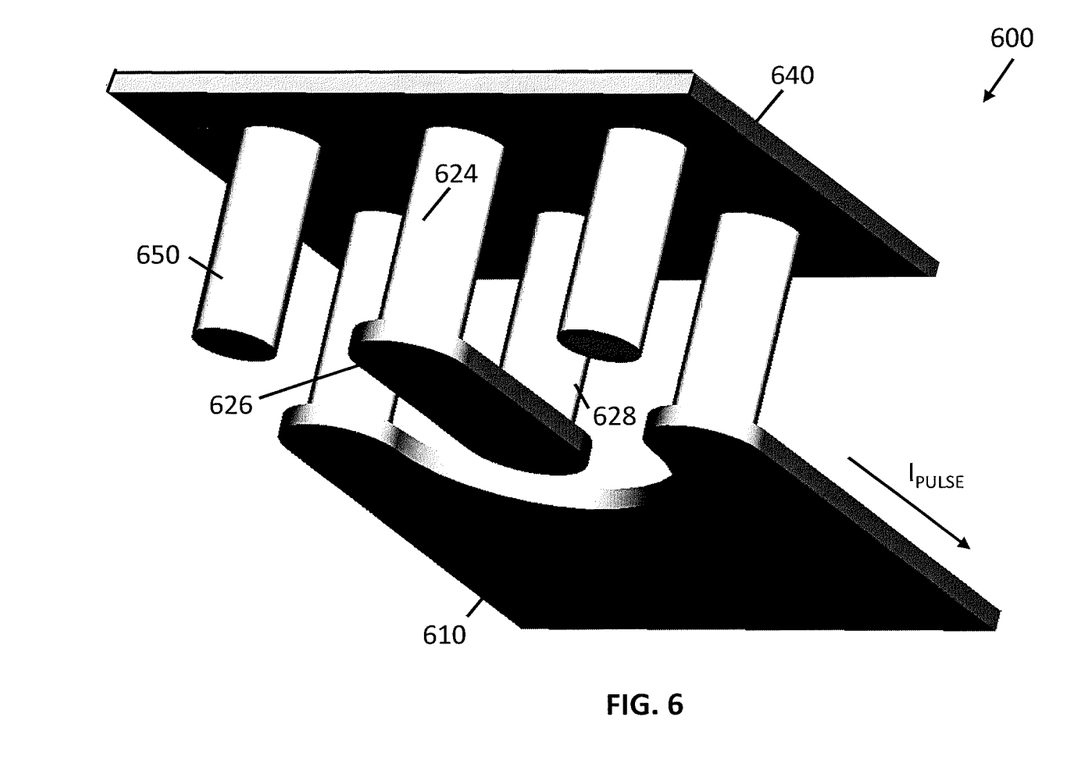
FIG. 6 illustrates a current measurement circuit according to an embodiment of the present invention that is partially integrated with the remainder of the pickup coil formed by die terminals and an external conductor that may form part of a mounting substrate such as a printed circuit board.

FIG. 6 illustrates a portion 600 of a current measurement circuit similar to current measurement circuit 500 according to an embodiment of the present invention. The integrated circuit die 640 connects to other substrates such as a mounting substrate with terminals such as terminal 650. The integrated circuit die 640 includes the remainder of the current measurement circuit, such as the integrator, threshold crossing detector, and sample and hold circuit. The portion 600 includes part of the pickup coil 620 formed by die terminals 624 and 628 and an external conductor 626 that may form part of a mounting substrate. The mounting substrate that includes conductor 626 may also include conductor 610 carrying the current pulse $I_{PULSE}$. The terminals of pickup coil 620 may be in the integrated circuit die 640 itself and may be connected to the remainder of the current measurement circuit.

The above description and drawings are only to be considered illustrative of specific embodiments, which achieve the features and advantages described herein. Modifications and substitutions to specific process conditions can be made. Accordingly, the embodiments of the invention are not considered as being limited by the foregoing description and drawings.

What is claimed is:

1. A current measurement circuit for measuring characteristics of a current pulse passing through a current conductor, comprising:
   a pickup coil for generating a voltage $V_{SENSE}'$ proportional to a magnetic field around the current conductor, wherein the magnetic field is proportional to a change in current through the current conductor over time;
   an amplifier connected to the pickup coil for amplifying $V_{SENSE}'$ to generate an amplified $V_{SENSE}'$; and
   at least one threshold crossing detector for comparing the amplified $V_{SENSE}'$ to at least one threshold voltage and generating an output signal based on the comparison, wherein the output signal is indicative of a transition time for the current pulse, and whether a slope of $V_{SENSE}'$ is positive or negative.

2. The current measurement circuit of claim 1, wherein the at least one threshold voltage is ground.

3. The current measurement circuit of claim 2, wherein the output signal is indicative of a start time of the current pulse when the output signal is indicative of a first transition time for the current pulse and the slope of $V_{SENSE}'$ changes from positive to negative in a first case or from negative to positive in a second case.

4. The current measurement circuit of claim 3, wherein the output signal is indicative of a peak amplitude time of the current pulse when the output signal is indicative of a second transition time after the first transition time for the current pulse and the slope of $V_{SENSE}'$ remains positive or remains negative.

5. The current measurement circuit of claim 3, wherein the output signal is indicative of an end time of the current pulse when the output signal is indicative of a third transition time after the first transition time for the current pulse and the slope of $V_{SENSE}'$ changes from negative to positive in the first case or from positive to negative in the second case.

6. The current measurement circuit of claim 1, wherein the pickup coil comprises a single loop configured to be arranged near the current conductor.

7. The current measurement circuit of claim 1, wherein the pickup coil is configured to not encircle the current conductor.

8. The current measurement circuit of claim 1, wherein the pickup coil comprises a Rogowski-type coil.

9. The current measurement circuit of claim 1, wherein the current measurement circuit is integrated on a single semiconductor chip.

10. The current measurement circuit of claim 9, wherein the single semiconductor chip further comprises the current conductor.

11. A current measurement circuit for measuring characteristics of a current pulse passing through a current conductor, comprising:
    a pickup coil for generating a voltage $V_{SENSE}'$ proportional to a magnetic field around the current conductor, wherein the magnetic field is proportional to a change in current through the current conductor over time;
    at least one threshold crossing detector for comparing $V_{SENSE}'$ to at least one threshold voltage and generating an output signal based on the comparison, wherein the output signal is indicative of a transition time for the current pulse, and whether a slope of $V_{SENSE}'$ is positive or negative;
    an integrator for integrating $V_{SENSE}'$ over time and generating an integrated signal $V_{SENSE}$ based on the integrated voltage; and
    a sample and hold circuit for comparing $V_{SENSE}$ to a peak amplitude time of the current pulse and generating a second output signal which can be used to measure the pulse current.

12. A current measurement circuit for measuring characteristics of a current pulse passing through a current conductor, comprising:
    a pickup coil for generating a voltage $V_{SENSE}'$ proportional to a magnetic field around the current conductor, wherein the magnetic field is proportional to a change in current through the current conductor over time; and
    at least one threshold crossing detector for comparing $V_{SENSE}'$ to at least one threshold voltage and generating an output signal based on the comparison, wherein the output signal is indicative of a transition time for the current pulse, and whether a slope of $V_{SENSE}'$ is positive or negative;
    wherein the pickup coil comprises one or more turns, and wherein the one or more turns are arranged to increase a total magnetic flux resulting from the current pulse and reduce a total magnetic flux resulting from other sources.

13. The current measurement circuit of claim 12, further comprising an amplifier for amplifying $V_{SENSE}'$ and connected to the pickup coil and to the at least one threshold crossing detector, wherein the at least one threshold crossing detector compares the amplified $V_{SENSE}'$.

14. A current measurement circuit for measuring characteristics of a current pulse passing through a current conductor, comprising:
    a pickup coil for generating a voltage $V_{SENSE}'$ proportional to a magnetic field around the current conductor, wherein the magnetic field is proportional to a change in current through the current conductor over time; and
    at least one threshold crossing detector for comparing $V_{SENSE}'$ to at least one threshold voltage and generating an output signal based on the comparison, wherein the output signal is indicative of a transition time for the current pulse, and whether a slope of $V_{SENSE}'$ is positive or negative;
    wherein the at least one threshold crossing detector and a first portion of the pickup coil are integrated on a semiconductor chip, and wherein a second portion of the pickup coil is formed by at least two die terminals and an external conductor.

15. The current measurement circuit of claim 14, wherein the external conductor forms part of a mounting substrate.

16. The current measurement circuit of claim 15, wherein the mounting substrate further comprises a portion of the current conductor.

* * * * *